(12) United States Patent
Lee et al.

(10) Patent No.: US 10,157,948 B2
(45) Date of Patent: Dec. 18, 2018

(54) IMAGE SENSORS WITH LIGHT CHANNELING REFLECTIVE LAYERS THEREIN

(71) Applicant: Samsung Electronics Co., Ltd., Suwon-si, Gyeonggi-do (KR)

(72) Inventors: Kyungho Lee, Suwon-si (KR); Hyuk An, Seoul (KR); Hyuk Soon Choi, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/232,650

(22) Filed: Aug. 9, 2016

(65) Prior Publication Data

US 2017/0047367 A1    Feb. 16, 2017

(30) Foreign Application Priority Data

Aug. 10, 2015 (KR) .......................... 10-2015-0112536

(51) Int. Cl.
 *H01L 27/146* (2006.01)

(52) U.S. Cl.
 CPC .... *H01L 27/14629* (2013.01); *H01L 27/1463* (2013.01); *H01L 27/1464* (2013.01);
 (Continued)

(58) Field of Classification Search
 CPC ........... H01L 27/14629; H01L 27/1463; H01L 27/14636; H01L 27/14621;
 (Continued)

(56) References Cited

U.S. PATENT DOCUMENTS 8,582,019 B2    11/2013  Fujii et al.
2012/0038814 A1*  2/2012  Tayanaka .......... H01L 27/14629
                                                    348/340
(Continued)

FOREIGN PATENT DOCUMENTS

JP     2013-229816 A    11/2013
JP     2014-182237 A     9/2014
(Continued)

*Primary Examiner* — Michael Trinh
(74) *Attorney, Agent, or Firm* — Myers Bigel, P.A.

(57) ABSTRACT

An image sensor includes a two-dimensional array of image sensor pixels, which are formed in a semiconductor layer. Each image sensor pixel is formed in a substrate having a corresponding semiconductor region therein. Each semiconductor region contains at least first and second photoelectric conversion elements, which are disposed at side-by-side locations therein. An electrically insulating isolation region is also provided, which extends at least partially through the semiconductor region and at least partially between the first and second photoelectric conversion elements, which may be configured respectively as first and second semiconductor regions of first conductivity type (e.g., N-type). At least one optically reflective region is also provided, which extends at least partially through the semiconductor region and surrounds at least a portion of at least one of the first and second photoelectric conversion elements. A semiconductor floating diffusion (FD) region (e.g., N-type region) is provided within the semiconductor region.

19 Claims, 12 Drawing Sheets

(52) U.S. Cl.
CPC .. *H01L 27/14621* (2013.01); *H01L 27/14627* (2013.01); *H01L 27/14636* (2013.01); *H01L 27/14645* (2013.01); *H01L 27/14685* (2013.01); *H01L 27/14689* (2013.01)

(58) Field of Classification Search
CPC ........... H01L 27/14627; H01L 27/1464; H01L 27/14685; H01L 27/14689; H01L 27/14645
See application file for complete search history.

(56) References Cited

U.S. PATENT DOCUMENTS

| | | | | |
|---|---|---|---|---|
| 2013/0200251 | A1* | 8/2013 | Velichko | ........... H01L 31/02327 |
| | | | | 250/208.1 |
| 2014/0054662 | A1* | 2/2014 | Yanagita | ............. H01L 27/1463 |
| | | | | 257/291 |
| 2014/0145287 | A1* | 5/2014 | Kato | ................. H01L 27/14621 |
| | | | | 257/432 |
| 2014/0285705 | A1 | 9/2014 | Uchida | |
| 2014/0299957 | A1 | 10/2014 | Hu et al. | |
| 2014/0374868 | A1 | 12/2014 | Lee et al. | |
| 2015/0028405 | A1* | 1/2015 | Minami | ........... H01L 27/14629 |
| | | | | 257/294 |
| 2015/0062394 | A1 | 3/2015 | Ikeda et al. | |
| 2016/0043119 | A1 | 2/2016 | Lee et al. | |
| 2016/0056200 | A1* | 2/2016 | Lee | ..................... H01L 27/1463 |
| | | | | 250/208.1 |

FOREIGN PATENT DOCUMENTS

| | | |
|---|---|---|
| KR | 10-2011-0059718 A | 6/2011 |
| KR | 10-2014-0121790 A | 10/2014 |
| KR | 10-2014-0141822 A | 12/2014 |
| KR | 10-2014-0147508 A | 12/2014 |
| KR | 10-2015-0012993 A | 2/2015 |
| KR | 10-2015-0026851 A | 3/2015 |

* cited by examiner

IMAGE SENSORS WITH LIGHT CHANNELING REFLECTIVE LAYERS THEREIN

REFERENCE TO PRIORITY APPLICATION

This U.S. non-provisional patent application claims priority under 35 U.S.C. § 119 to Korean Patent Application No. 10-2015-0112536, filed Aug. 10, 2015, in the Korean Intellectual Property Office, the disclosure of which is incorporated herein by reference in its entirety.

BACKGROUND

The inventive concepts relate to an image sensor and, more particularly, to an image sensor with improved image quality.

Image sensors are semiconductor devices capable of converting an optical image into electrical signals. Image sensors may be categorized as any one of charge coupled device (CCD) type image sensors and complementary metal-oxide-semiconductor (CMOS) type image sensors.

As semiconductor devices have been highly integrated, image sensors have also been highly integrated and sizes of pixels have been reduced. Thus, various researches are conducted for an image sensor capable of reducing crosstalk and improving sensitivity in a fine area.

SUMMARY

Embodiments of the inventive concepts may provide an image sensor capable of reducing or minimizing crosstalk. In some of these embodiments, an image sensor includes a two-dimensional array of image sensor pixels, which are formed in a semiconductor layer. In some of these embodiments, each image sensor pixel is formed in a substrate having a corresponding semiconductor region therein. Each semiconductor region contains at least first and second photoelectric conversion elements, which are disposed at side-by-side locations therein. An electrically insulating isolation region is also provided, which extends at least partially through the semiconductor region and at least partially between the first and second photoelectric conversion elements, which may be configured respectively as first and second semiconductor regions of first conductivity type (e.g., N-type). At least one optically reflective region is also provided, which extends at least partially through the semiconductor region and surrounds at least a portion of at least one of the first and second photoelectric conversion elements. A semiconductor floating diffusion (FD) region (e.g., N-type region) is provided within the semiconductor region. According to some embodiments of the invention, the FD region extends between the first and second photoelectric conversion elements and opposite the electrically insulating isolation region. In particular, the electrically insulating isolation region may extend between a back surface of the semiconductor region, which is configured to receive incident light thereon, and the floating diffusion region.

According to additional embodiments of the invention, the semiconductor region may have a trench therein that surrounds at least uppermost portions of the first and second photoelectric conversion elements on four sides thereof. In some of these embodiments, the optically reflective region may at least partially fill the trench and surround the uppermost portions of the first and second photoelectric conversion elements when viewed in a direction normal to a surface of the semiconductor region. In still further embodiments of the invention, the electrically insulating isolation region may include optically reflective material therein. The optically reflective region and the optically reflective material may be metals selected from a group consisting of tungsten (W), copper (Cu) and aluminum (Al). According to additional embodiments of the invention, the optically reflective region extends entirely through the semiconductor region and surrounds the first and second photoelectric conversion elements on four sides thereof. The optically reflective region may also be electrically isolated from the semiconductor region by an electrically insulating material.

According to further embodiments of the invention, an image sensor may include a semiconductor layer, a first isolation layer disposed in the semiconductor layer to define a unit pixel region of the semiconductor layer, a first photoelectric conversion element and a second photoelectric conversion element that are disposed in the semiconductor layer of the unit pixel region, and a second isolation layer disposed in the semiconductor layer of the unit pixel region and disposed between the first photoelectric conversion element and the second photoelectric conversion element. The first isolation layer may surround the first photoelectric conversion element and the second photoelectric conversion element, and the first isolation layer may include a vertical reflective layer.

In a further embodiment, the first isolation layer may include first patterns extending in one direction and second patterns disposed between the first patterns so as to be connected to the first patterns. The second isolation layer may be connected to the first patterns of the first isolation layer and may be spaced apart from the second patterns of the first isolation layer. The second isolation layer may include an additional vertical reflective layer. The additional vertical reflective layer may be connected to the vertical reflective layers included in the first patterns of the first isolation layer.

In an additional embodiment, the first isolation layer may include first patterns extending in one direction and second patterns disposed between the first patterns so as to be connected to the first patterns. The second isolation layer may be spaced apart from the first patterns and the second patterns of the first isolation layer. The second isolation layer may also include an additional vertical reflective layer and an insulating layer disposed between the additional vertical reflective layer and the semiconductor layer.

In an additional embodiment, the first isolation layer may further include a vertical insulating layer covering a surface of the vertical reflective layer. The vertical insulating layer may include the same material as the second isolation layer. The first isolation layer may further include an air gap disposed in the vertical reflective layer. And, a width of the first isolation layer may be greater than that of the second isolation layer.

In an additional embodiment, the semiconductor layer may include a first surface on which light is incident, and a second surface opposite to the first surface. A distance between a bottom surface of the first isolation layer and the second surface of the semiconductor layer may be smaller than a distance between a bottom surface of the second isolation layer and the second surface of the semiconductor layer.

In an additional embodiment, the semiconductor layer may include a first surface on which light is incident, and a second surface opposite to the first surface. The first isolation layer may penetrate the semiconductor layer, and a bottom surface of the second isolation layer may be spaced apart from the second surface of the semiconductor layer.

In an additional embodiment, the image sensor may further include a floating diffusion region disposed in the semiconductor layer of the unit pixel region. The floating diffusion region may be disposed between the first photoelectric conversion element and the second photoelectric conversion element, and the floating diffusion region may vertically overlap with the second isolation layer but may not vertically overlap with the first isolation layer.

In an embodiment, an image sensor may include a semiconductor layer, a first photoelectric conversion element and a second photoelectric conversion element that are disposed in the semiconductor layer, a first isolation layer disposed in the semiconductor layer and surrounding the first and second photoelectric conversion elements, a second isolation layer disposed in the semiconductor layer and isolating the first and second photoelectric conversion elements from each other, and a color filter vertically overlapping with both the first photoelectric conversion element and the second photoelectric conversion element when viewed from a plan view. The first isolation layer may include a vertical reflective layer.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
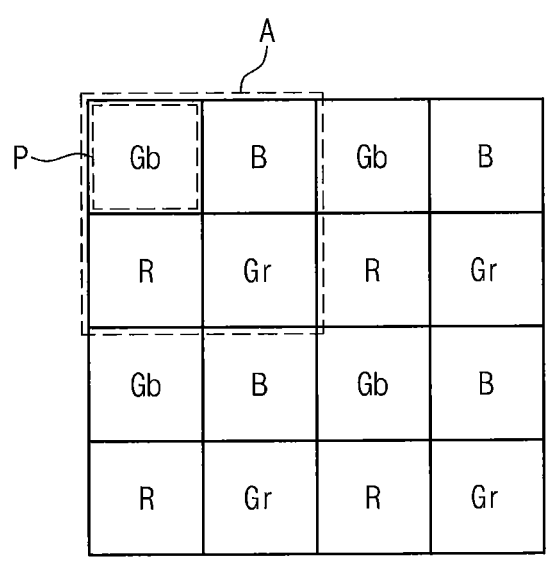
FIG. 1 is a schematic plan view illustrating an image sensor according to embodiments of the inventive concepts.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings.

It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity. The same reference numerals or the same reference designators denote the same elements throughout the specification.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

In addition, exemplary embodiments are described herein with reference to cross-sectional views and/or plan views that are idealized exemplary views. In the drawings, the thicknesses of layers and regions are exaggerated for clarity. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Figure 2A:
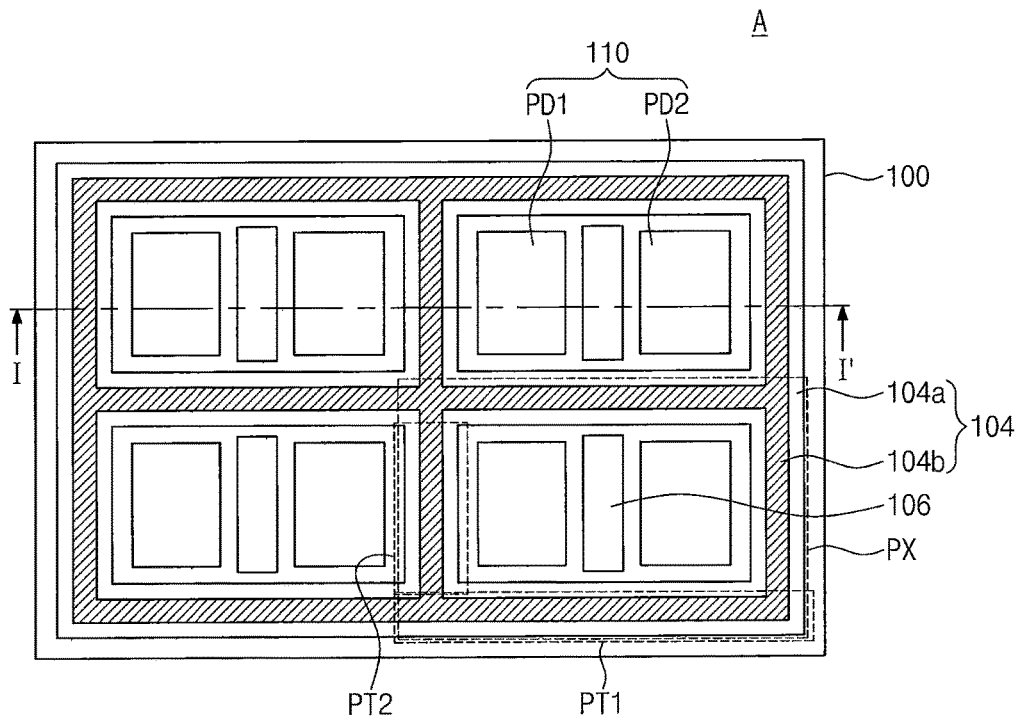
FIGS. 2A and 2B are enlarged views of a portion 'A' of FIG. 1 to illustrate image sensors according to embodiments of the inventive concepts.
Figure 2B:
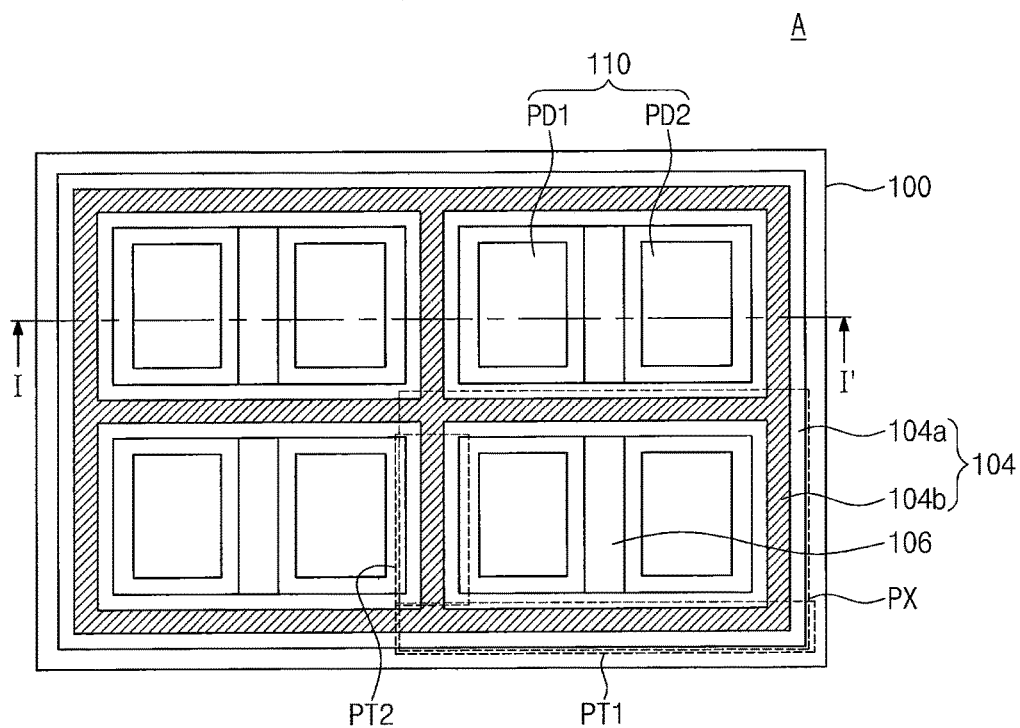
Figure 3:
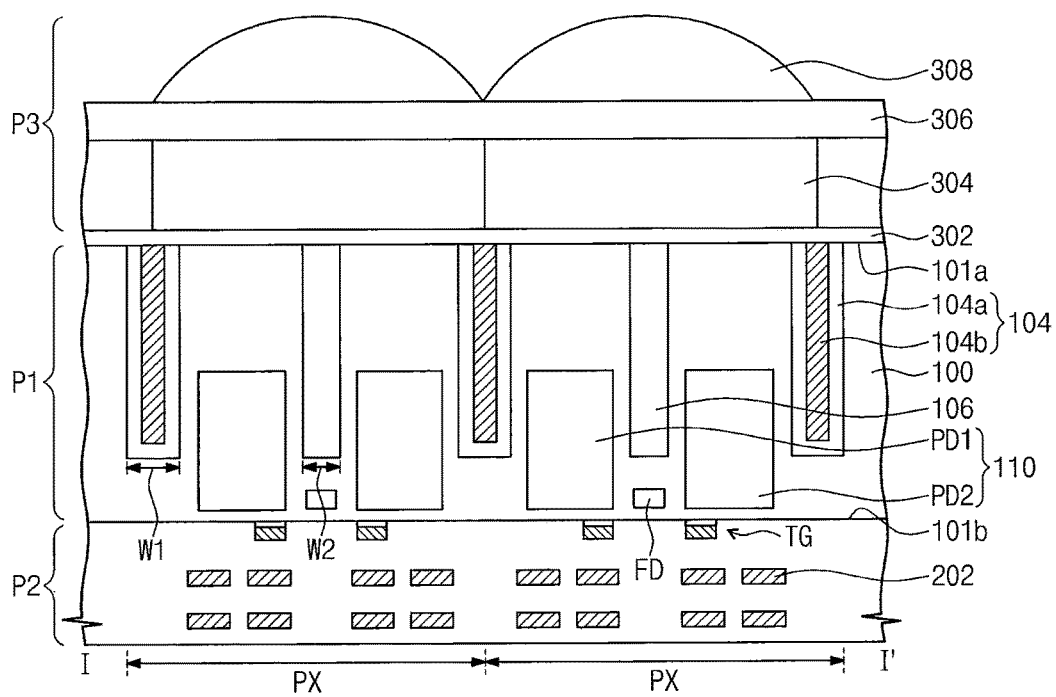
FIG. 3 is a cross-sectional view taken along a line I-I' of FIG. 2A or 2B to illustrate an image sensor according to embodiments of the inventive concepts.

FIG. 1 is a schematic plan view illustrating an image sensor according to embodiments of the inventive concepts. FIGS. 2A and 2B are enlarged views of a portion 'A' of FIG. 1 to illustrate image sensors according to embodiments of the inventive concepts. FIG. 3 is a cross-sectional view taken along a line I-I' of FIG. 2A or 2B to illustrate an image sensor according to embodiments of the inventive concepts.

Referring to FIGS. 1, 2A, 2B, and 3, an image sensor may include unit pixels P arranged in a matrix form. At least one photoelectric conversion element 110 may be disposed in each of the unit pixels P. The image sensor may include a light receiving part P1, an interconnection part P2, and a light filter part P3. The light receiving part P1 may include a semiconductor layer 100, the photoelectric conversion elements 110, and a first isolation layer 104 defining unit pixel regions PX of the semiconductor layer 100. In an embodiment, the semiconductor layer 100 may be a single-crystalline semiconductor substrate. In an embodiment, the semiconductor layer 100 may be an epitaxial layer formed by an epitaxial growth process. The semiconductor layer 100 may include a back surface 101a and a front surface 101b. The back surface 101a of the semiconductor layer 100 may be a surface on which light is incident.

The photoelectric conversion elements 110 may be disposed in the semiconductor layer 100. The photoelectric conversion elements 110 may be two-dimensionally arranged in the semiconductor layer 100 to constitute a two-dimensional array. The photoelectric conversion elements 110 may be doped with, for example, N-type dopants. The photoelectric conversion elements 110 may be more adjacent to the front surface 101b of the semiconductor layer 100.

The photoelectric conversion element 110 may include a first photoelectric conversion element PD1 and a second photoelectric conversion element PD2 that are disposed in each of the unit pixel regions PX. In other words, two photoelectric conversion elements may be disposed in one unit pixel region PX. Each of the first and second photoelectric conversion elements PD1 and PD2 may independently collect light incident upon and passing through the back surface 101a of the semiconductor layer 100.

A floating diffusion region FD may be disposed in the semiconductor layer 100. The floating diffusion region FD may be disposed in each of the unit pixel regions PX. In an embodiment, the floating diffusion region FD may be disposed between the first photoelectric conversion element PD1 and the second photoelectric conversion element PD2 in each of the unit pixel regions PX. In an embodiment, the floating diffusion region FD may be doped with N-type dopants.

The first isolation layer 104 and a second isolation layer 106 may be disposed in the semiconductor layer 100. In an embodiment, the first isolation layer 104 may surround the first and second photoelectric conversion elements PD1 and PD2 when viewed from a plan view. The first isolation layer 104 may include first patterns PT1 extending in one direction and second patterns PT2 disposed between the first patterns PT1 so as to be connected to the first patterns PT1 when viewed from a plan view. The first isolation layer 104 may not vertically overlap with the floating diffusion region FD.

The first isolation layer 104 may include a multi-layer. In an embodiment, the first isolation layer 104 may include a vertical insulating layer 104a and a vertical reflective layer 104b. The vertical reflective layer 104b may surround the first and second photoelectric conversion elements PD1 and PD2 disposed in each of the unit pixel regions PX when viewed from a plan view. The vertical insulating layer 104a may cover sidewalls and a bottom surface of the vertical reflective layer 104b. For example, the vertical insulating layer 104a may include at least one of a silicon oxide layer, a silicon nitride layer, a silicon oxynitride layer, or a hafnium oxide layer. For example, the vertical reflective layer 104b may include a metal material (e.g., tungsten, copper, and/or aluminum).

Figure 4:
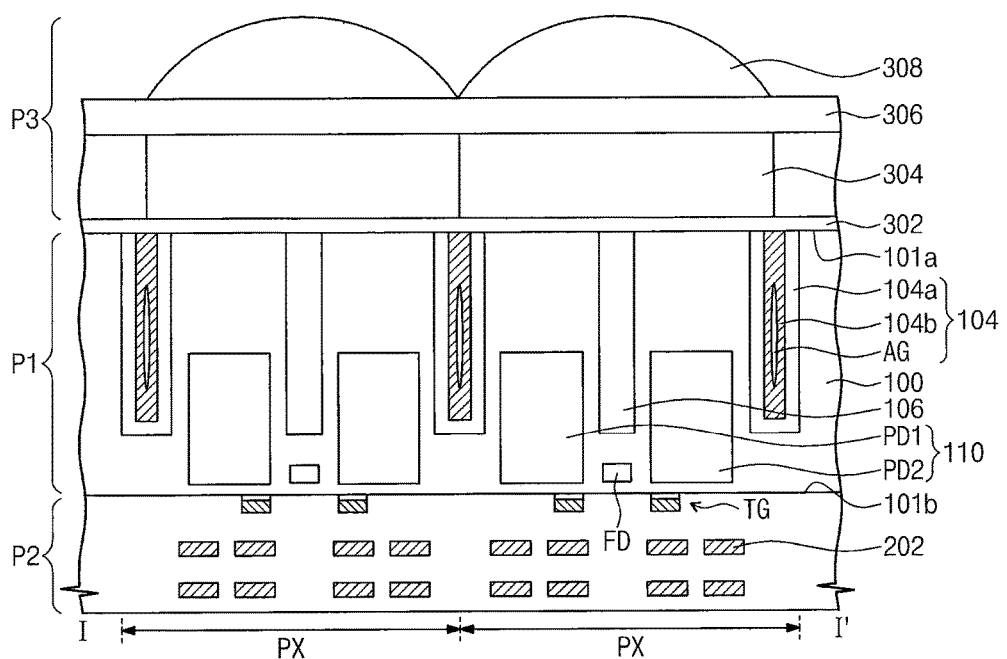
FIG. 4 is a cross-sectional view taken along the line I-I' of FIG. 2A or 2B to illustrate an image sensor according to embodiments of the inventive concepts.

Alternatively, as illustrated in FIG. 4, the first isolation layer 104 may include an air gap AG. The air gap AG may be disposed in the vertical reflective layer 104b. In an embodiment, the air gap AG may extend along the vertical reflective layer 104b when viewed from a plan view. In an embodiment, the air gap AG may not extend along the vertical reflective layer 104b when viewed from a plan view. For example, the air gap AG may exist in a portion of the vertical reflective layer 104b but may not exist in another portion of the vertical reflective layer 104b.

Referring again to FIG. 3, the second isolation layer 106 may be disposed in the semiconductor layer 100 of each of the unit pixel regions PX. The second isolation layer 106 may isolate the first and second photoelectric conversion elements PD1 and PD2 from each other in one unit pixel region PX. In an embodiment, as illustrated in FIG. 2A, the second isolation layer 106 may be spaced apart from the first patterns PT1 and the second patterns PT2 of the first isolation layer 104 and may be parallel to the second patterns PT2. In an embodiment, as illustrated in FIG. 2B, the second isolation layer 106 may be in contact with the first patterns PT1 of the first isolation layer 104 and may be spaced apart from the second patterns PT2 of the first isolation layer 104. The second isolation layer 106 may be parallel to the second patterns PT2 of the first isolation layer 104. For example, the second isolation layer 106 may be in contact with the vertical insulating layer 104a included in the first patterns PT1 of the first isolation layer 104. The second isolation layer 106 may vertically overlap with the floating diffusion region FD.

In an embodiment, the second isolation layer 106 may include the same material as the vertical insulating layer 104a. Alternatively, the second isolation layer 106 may include a different material from the vertical insulating layer 104a. For example, the second isolation layer 106 may include at least one of a silicon oxide layer, a silicon nitride layer, a silicon oxynitride layer, or a hafnium oxide layer.

A width W1 of the first isolation layer 104 may be different from a width W2 of the second isolation layer 106. In an embodiment, the width W1 of the first isolation layer 104 may be greater than the width W2 of the second isolation layer 106 (W1>W2). A depth of the first isolation layer 104 may be substantially equal to that of the second isolation layer 106. In other words, a bottom surface of the first isolation layer 104 may be disposed at the substantially same level as a bottom surface of the second isolation layer 106. The bottom surface of the first isolation layer 104 and the bottom surface of the second isolation layer 106 may be disposed within the semiconductor layer 100. The bottom surface of the first isolation layer 104 and the bottom surface of the second isolation layer 106 may be spaced apart from the front surface 101b of the semiconductor layer 100.

The interconnection part P2 may be disposed on the front surface 101b of the semiconductor layer 100. The interconnection part P2 may include a plurality of stacked insulating layers and conductive patterns 202 disposed between the insulating layers. In an embodiment, the interconnection part P2 may include transfer gates TG. The transfer gates TG may be disposed on the front surface 101b of the semiconductor layer 100. In an embodiment, two transfer gates TG may be disposed to correspond to the first photoelectric conversion element PD1 and the second photoelectric conversion element PD2 included in one unit pixel region PX, respectively.

The light filter part P3 may be disposed on the back surface 101a of the semiconductor layer 100. The light filter part P3 may include an insulating layer 302, color filters 304, and micro-lenses 308.

The insulating layer 302 may be disposed on the back surface 101a of the semiconductor layer 100. The insulating layer 302 may cover the back surface 101a of the semiconductor layer 100, a top surface of the first isolation layer 104, and a top surface of the second isolation layer 106. In an embodiment, the insulating layer 302 may function as an anti-reflection layer. For example, the insulating layer 302 may include at least one of a silicon oxide layer, a silicon nitride layer, a silicon oxynitride layer, or a hafnium oxide layer.

Color filters 304 may be disposed on the insulating layer 302. The color filters 304 may correspond to the unit pixel regions PX, respectively. In an embodiment, one color filter 304 may vertically overlap with the first photoelectric conversion element PD1, the second photoelectric conversion element PD2, and the second isolation layer 106 which are disposed in one unit pixel region PX.

The color filters 304 may include green filters Gb and Gr of FIG. 1, blue filters B of FIG. 1, and red filters R of FIG. 1. In FIG. 1, the color filters 304 may be arranged in a Bayer pattern. In the Bayer pattern, a half of the total pixels may be the green filters Gb and Gr which are the most sensitive to human eyes.

The micro-lenses 308 may be disposed on the color filters 304. For example, the micro-lenses 308 may be disposed on the color filters 304, respectively.

A planarization layer 306 may be disposed between the color filters 304 and the micro-lenses 308. The planarization layer 306 may cover top surfaces of the color filters 304. In an embodiment, the planarization layer 306 may include at least one of a silicon oxide layer, a silicon nitride layer, or a silicon oxynitride layer. In an embodiment, the planarization layer 306 may include an organic layer.

Figure 5:
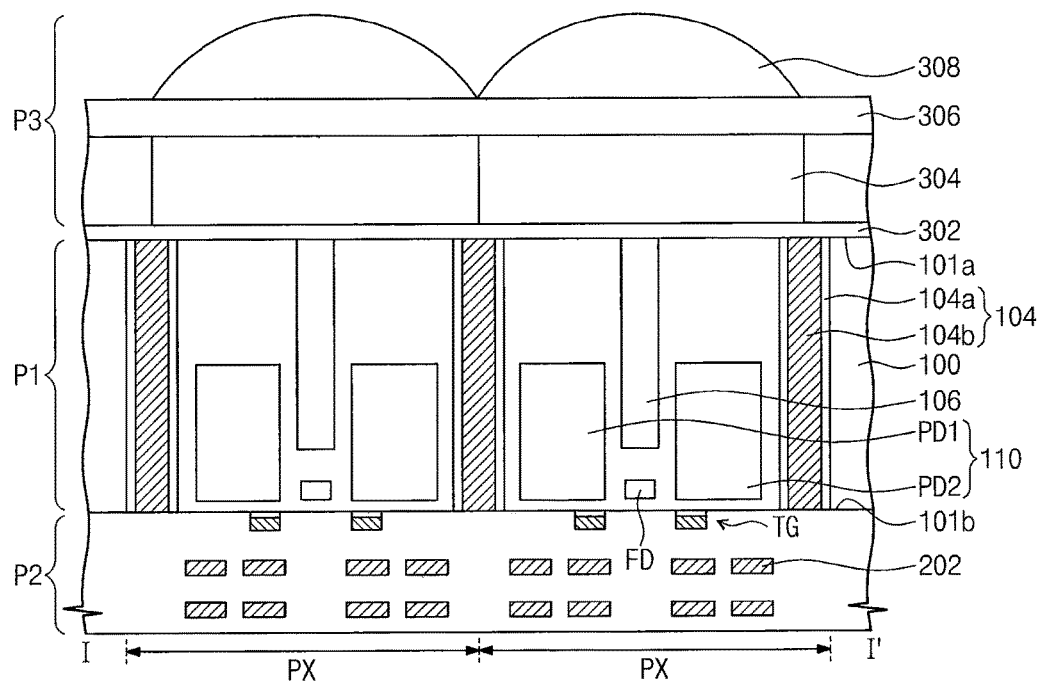
FIG. 5 is a cross-sectional view taken along the line I-I' of FIG. 2A or 2B to illustrate an image sensor according to embodiments of the inventive concepts.
Figure 6:
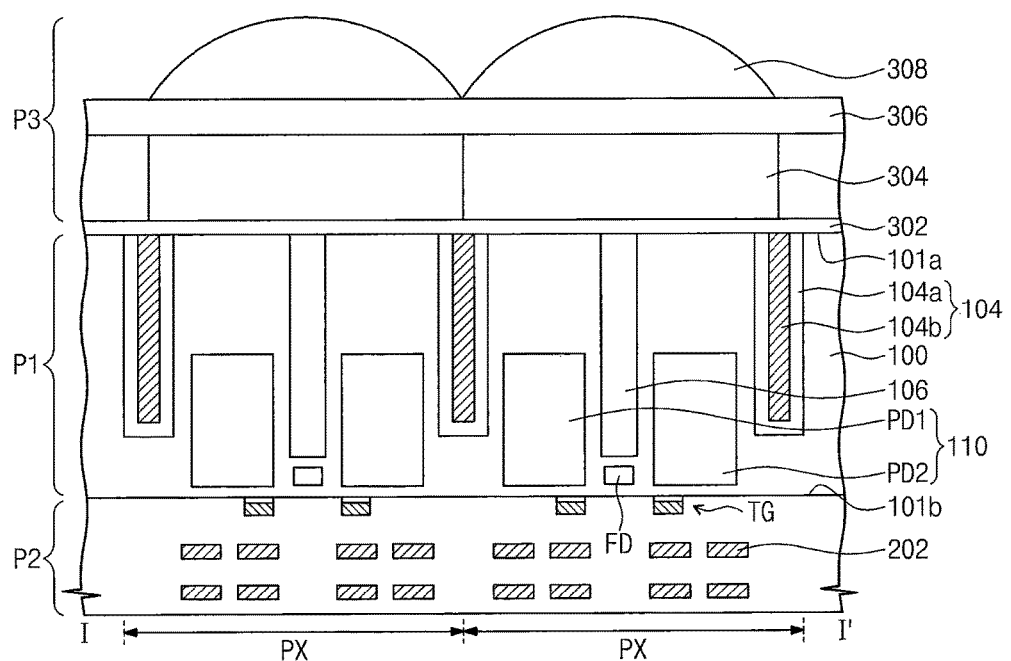
FIG. 6 is a cross-sectional view taken along the line I-I' of FIG. 2A or 2B to illustrate an image sensor according to embodiments of the inventive concepts.

FIGS. 5 and 6 are cross-sectional views taken along the line I-I' of FIG. 2A or 2B to illustrate image sensors according to embodiments of the inventive concepts. In the embodiments of FIGS. 5 and 6, the same elements as described in the embodiment of FIG. 3 will be indicated by the same reference numerals or the same reference designators, and the descriptions to the same elements as in the embodiment of FIG. 3 will be omitted or mentioned briefly for the purpose of ease and convenience in explanation.

Referring to FIG. 5, a first isolation layer 104 and a second isolation layer 106 may be disposed in the semiconductor layer 100. In the present embodiment, the first isolation layer 104 and the second isolation layer 106 may have depths different from each other. In an embodiment, a distance between a bottom surface of the first isolation layer 104 and the front surface 101b of the semiconductor layer 100 may be smaller than a distance between a bottom surface of the second isolation layer 106 and the front surface 101b of the semiconductor layer 100. For example, the vertical reflective layer 104b may penetrate the semiconductor layer 100. In this case, the vertical insulating layer 104a may cover the sidewalls of the vertical reflective layer 104b. The second isolation layer 106 may not penetrate the semiconductor layer 100.

Referring to FIG. 6, a distance between a bottom surface of the second isolation layer 106 and the front surface 101b of the semiconductor layer 100 may be smaller than a distance between a bottom surface of the first isolation layer 104 and the front surface 101b of the semiconductor layer 100. In other words, the bottom surface of the second isolation layer 106 may be disposed at a lower level than the bottom surface of the first isolation layer 104.

Figure 7:
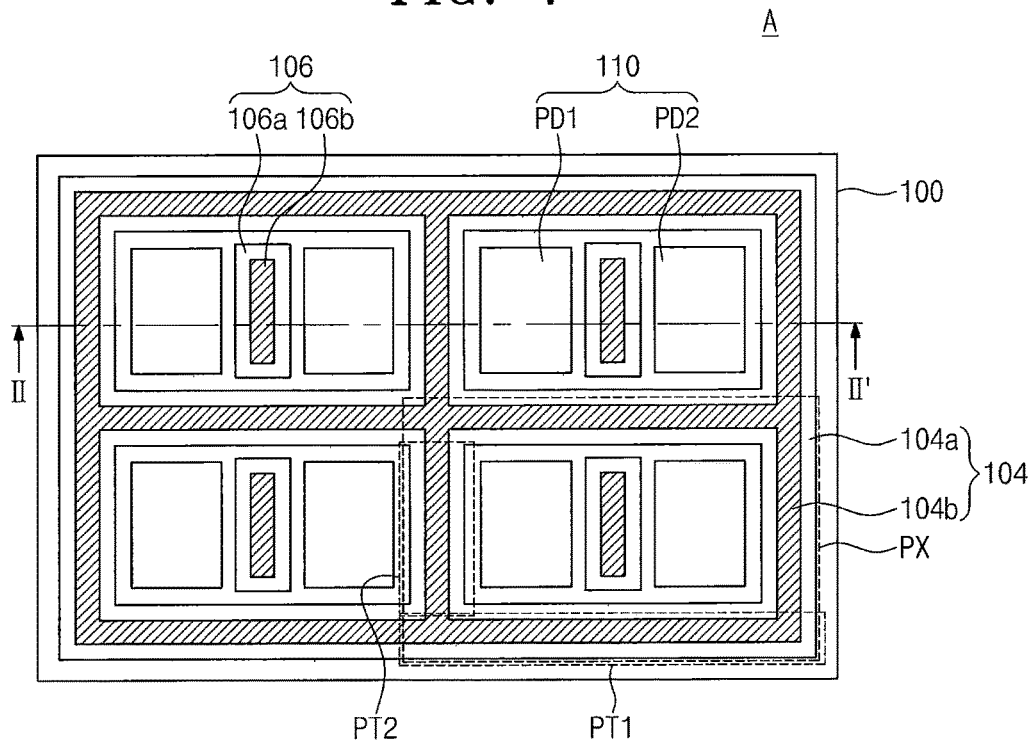
FIGS. 7 and 8 are enlarged views of the portion 'A' of FIG. 1 to illustrate image sensors according to embodiments of the inventive concepts.
Figure 8:
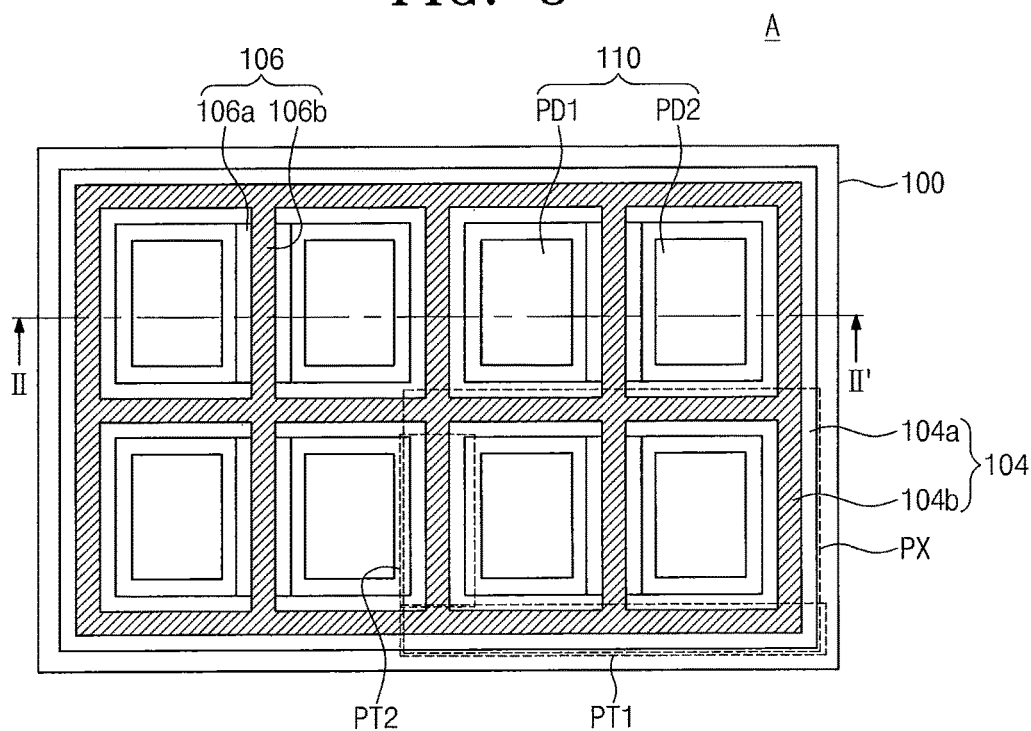
Figure 9:
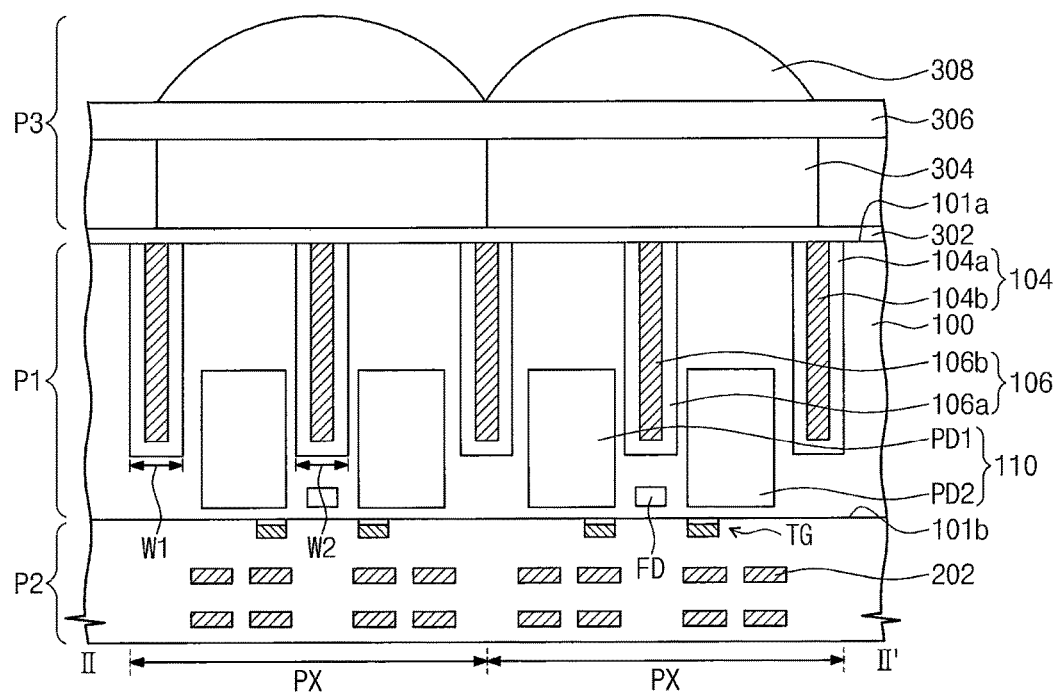
FIG. 9 is a cross-sectional view taken along a line II-II' of FIG. 7 or 8 to illustrate an image sensor according to embodiments of the inventive concepts.

FIGS. 7 and 8 are enlarged views of the portion 'A' of FIG. 1 to illustrate image sensors according to embodiments of the inventive concepts. FIG. 9 is a cross-sectional view taken along a line II-II' of FIG. 7 or 8 to illustrate an image sensor according to embodiments of the inventive concepts. In the embodiments of FIGS. 7 to 9, the same elements as described in the embodiments of FIGS. 2A, 2B, and 3 will be indicated by the same reference numerals or the same reference designators, and the descriptions to the same elements as in the embodiments of FIGS. 2A, 2B, and 3 will be omitted or mentioned briefly for the purpose of ease and convenience in explanation.

Referring to FIGS. 7 to 9, a first isolation layer 104 and a second isolation layer 106 may be disposed in the semiconductor layer 100. In an embodiment, the first isolation layer 104 may define unit pixel regions PX of the semiconductor layer 100 and may surround first and second photoelectric conversion elements PD1 and PD2 disposed in each of the unit pixel regions PX. In an embodiment, the first isolation layer 104 may include a multi-layer. The first isolation layer 104 may include a first vertical insulating layer 104a and a first vertical reflective layer 104b.

The second isolation layer 106 may be disposed in each of the unit pixel regions PX. In an embodiment, the second isolation layer 106 may isolate the first and second photoelectric conversion elements PD1 and PD2 from each other in each of the unit pixel regions PX. In an embodiment, the second isolation layer 106 may include a multi-layer. The second isolation layer 106 may include a second vertical insulating layer 106a and a second vertical and optically reflective layer 106b, which operates to confine and channel light incident the image sensor. The second vertical insulating layer 106a may cover sidewalls and a bottom surface of the second vertical reflective layer 106b.

In an embodiment, as illustrated in FIG. 7, the second isolation layer 106 may be spaced apart from the first isolation layer 104. Thus, the second vertical reflective layer 106b may also be spaced apart from the first vertical reflective layer 104b. In an embodiment, as illustrated in FIG. 8, the second isolation layer 106 may be in contact with the first isolation layer 104. Thus, the second vertical reflective layer 106b may also be in contact with the first vertical reflective layer 104b. In other word, the second vertical reflective layer 106b may intersect the first vertical reflective layer 104b included in the first patterns PT1 of the first isolation layer 104.

Referring again to FIGS. 7 to 9, a width W1 of the first isolation layer 104 may be equal to a width W2 of the second isolation layer 106 (W1=W2). In addition, a depth of the first isolation layer 104 may be equal to a depth of the second isolation layer 106. Even though not shown in the drawings, the widths and the depths of the first and second isolation layers 104 and 106 may not be limited to these descriptions according to the present embodiment but may be variously modified as described with reference to FIGS. 3 to 6.

FIGS. 10A to 10D are cross-sectional views taken along the line I-I' of FIG. 2A or 2B to illustrate a method of manufacturing an image sensor according to embodiments of the inventive concepts.

Figure 10A:
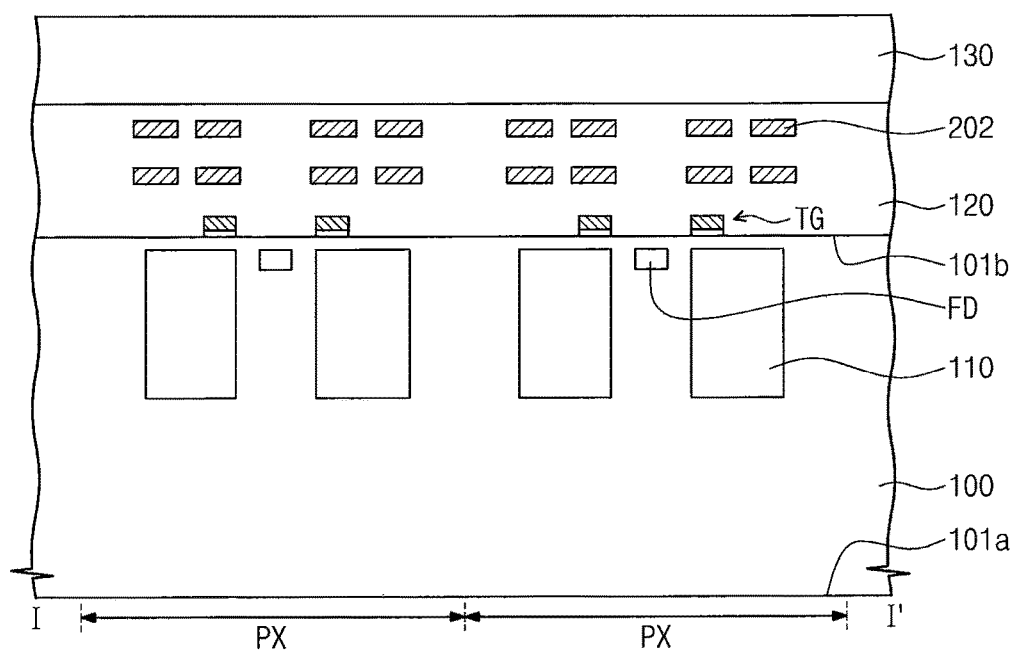
FIGS. 10A to 10D are cross-sectional views taken along the line I-I' of FIG. 2A or 2B to illustrate a method of manufacturing an image sensor according to embodiments of the inventive concepts.

Referring to FIGS. 2A, 2B, and 10A, a semiconductor layer 100 may be provided. In an embodiment, the semiconductor layer 100 may be a single-crystalline semiconductor substrate. In an embodiment, the semiconductor layer 100 may be an epitaxial layer formed by an epitaxial growth process. The semiconductor layer 100 may include a back surface 101a and a front surface 101b opposite to the back surface 101a. The back surface 101a of the semiconductor layer 100 may be a surface on which light is incident.

Photoelectric conversion elements 110 may be formed in the semiconductor layer 100. The photoelectric conversion elements 110 may be formed by performing an ion implantation process through the front surface 101b of the semiconductor layer 100. The photoelectric conversion elements 110 may be doped with, for example, N-type dopants. The floating diffusion regions FD may be formed in the semiconductor layer 100. In an embodiment, each of the floating diffusion regions FD may be formed between a pair of the photoelectric conversion elements 110 disposed in each of unit pixel regions PX to be defined. The floating diffusion regions FD may be doped with, for example, N-type dopants.

Transfer gates TG may be formed on the front surface 101b of the semiconductor layer 100. The transfer gates TG may be formed to correspond to the photoelectric conversion elements 110, respectively.

An interconnection structure 120 may be formed on the front surface 101b of the semiconductor layer 100. The interconnection structure 120 may include a plurality of stacked insulating layers. In addition, the interconnection structure 120 may further include metal interconnections 202 formed in the stacked insulating layers. The insulating layers of the interconnection structure 120 may cover the transfer gates TG.

A support substrate 130 may be adhered to a top surface of the interconnection structure 120. The support substrate 130 may support deposited layers in processes of manufacturing the image sensor. For example, the support substrate 130 may be a silicon substrate or a glass substrate.

Figure 10B:
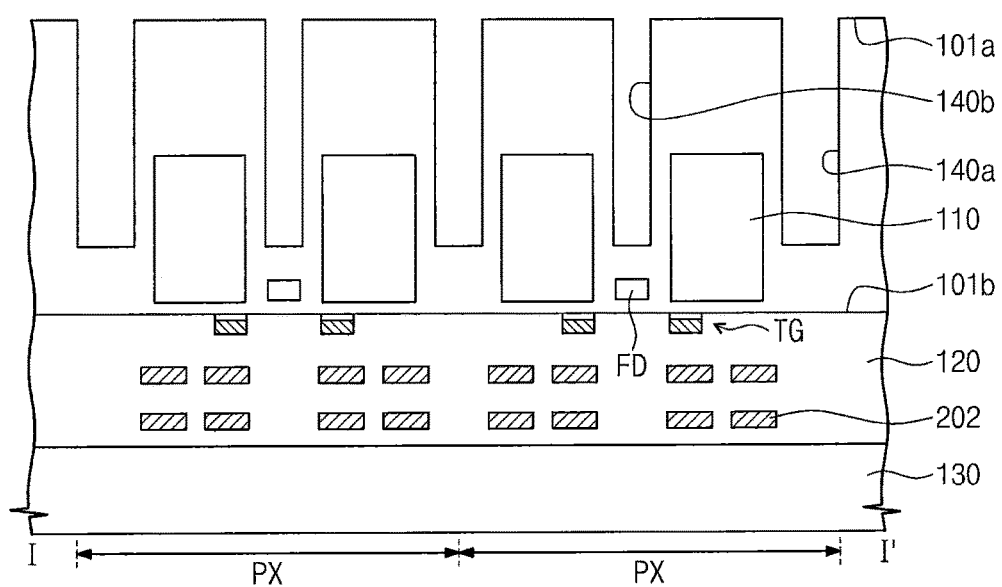

Referring to FIGS. 2A, 2B, and 10B, the back surface 101b of the semiconductor layer 100 may be selectively etched to form first trenches 140a and second trenches 140b in the semiconductor layer 100. The first trenches 140a may define unit pixel regions PX. The first trenches 140a may be formed to surround two photoelectric conversion elements 110 adjacent to each other on all four sides thereof. In other word, the two photoelectric conversion elements 110 may be disposed in each of the unit pixel regions PX. Each of the second trenches 140b may be formed in each of the unit pixel regions PX of the semiconductor layer 100. Each of the second trenches 140b may physically separate the two photoelectric conversion elements 110 disposed in each unit pixel region PX from each other. Widths of the first trenches 140a may be greater than those of the second trenches 140b. Alternatively, the widths of the first trenches 140a may be equal to those of the second trenches 140b.

Figure 10C:
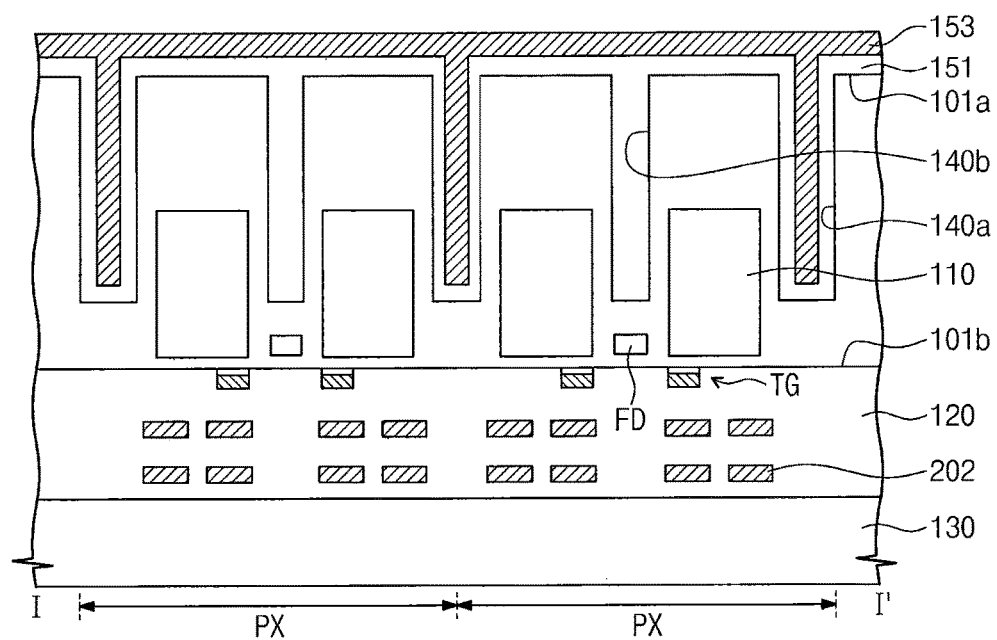

Referring to FIGS. 2A, 2B, and 10C, an isolation insulating layer 151 may be formed on the back surface 101a of the semiconductor layer 100. In an embodiment, the isolation insulating layer 151 may be conformally formed on inner surfaces of the first trenches 140a but may completely fill the second trenches 104b. When the widths of the second trenches 140b are smaller than those of the first trenches 140a, the second trenches 140b may be completely filled with the isolation insulating layer 151 while the isolation insulating layer 151 is conformally formed on the inner surfaces of the first trenches 140a. Thus, empty regions may remain in the first trenches 140a after the formation of the isolation insulating layer 151. For example, the isolation insulating layer 151 may include at least one of a silicon oxide layer, a silicon nitride layer, a silicon oxynitride layer, or a hafnium oxide layer.

A reflective layer 153 may be formed on the isolation insulating layer 151. The reflective layer 153 may cover a top surface of the isolation insulating layer 151 and may completely fill the remaining empty regions of the first trenches 140a. In an embodiment, the reflective layer 153 may not completely fill the first trenches 140a partially filled with the isolation insulating layer 151 since the first trenches 140a are narrow. In this case, an air gap AG of FIG. 4 may be formed in the reflective layer 153 in the first trench 140a. For example, the reflective layer 153 may include a conductive material (e.g., tungsten, copper, or aluminum).

Figure 10D:
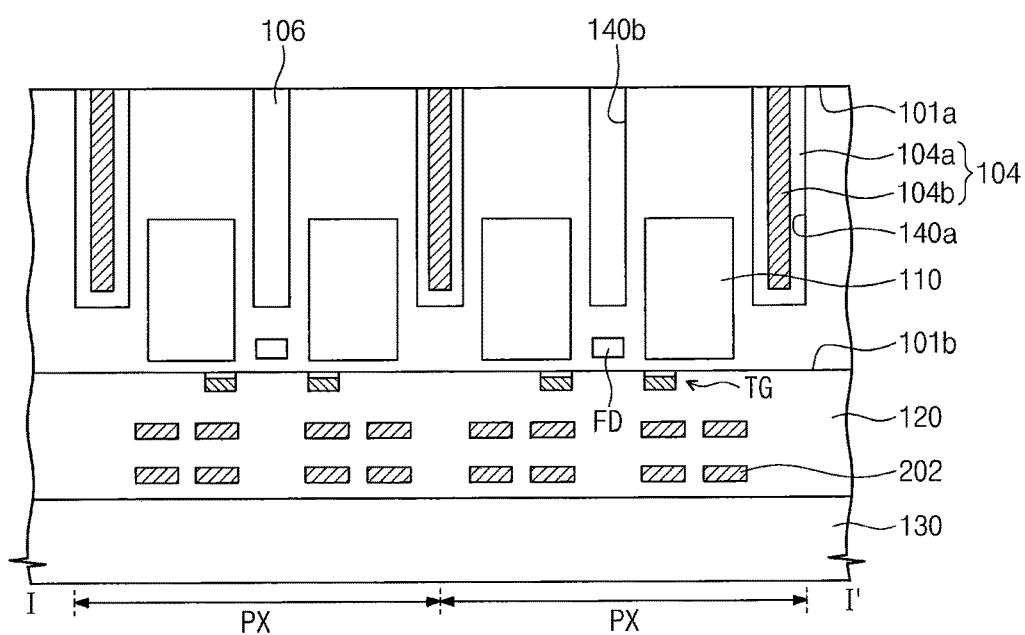

Referring to FIG. 10D, an etching process may be performed on the reflective layer 153 to form first isolation layers 104 in the first trenches 140a and second isolation layers 106 in the second trenches 140b. The etching process may be performed until the back surface 101a of the semiconductor layer 100 is exposed. The etching process may include a chemical mechanical polishing (CMP) process and/or an etch-back process. The first isolation layer 104 may have a multi-layered structure. For example, the first isolation layer 104 may include a vertical insulating layer 104a and a vertical reflective layer 104b. The second isolation layer 106 may have a single-layered structure. The second isolation layer 106 may include the same material as the vertical insulating layer 104a.

Referring again to FIGS. 2A, 2B, and 3, an insulating layer 302 may be formed on the back surface 101a of the semiconductor layer 100. The insulating layer 302 may cover the back surface 101a of the semiconductor layer 100, a top surface of the first isolation layer 104, and a top surface of the second isolation layer 106. For example, the insulating layer 302 may include at least one of a silicon oxide layer, a silicon nitride layer, a silicon oxynitride layer, or a hafnium oxide layer.

Color filters 304 may be formed on the insulating layer 302. The color filters 304 may correspond to the unit pixel regions PX, respectively. In an embodiment, the color filters 304 may be arranged in the Bayer pattern, as illustrated in FIG. 1. A planarization layer 306 may be formed on the color filters 304. In an embodiment, the planarization layer 306 may include at least one of a silicon oxide layer, a silicon nitride layer, or a silicon oxynitride layer. In an embodiment, the planarization layer 306 may include an organic layer. Micro-lenses 308 may be formed on the planarization layer 306. The support substrate 130 may be removed after the formation of the micro-lenses 308.

As described above, the image sensor according to embodiments of the inventive concepts may include the first isolation layer defining the unit pixel region and including the vertical reflective layer, and the second isolation layer disposed in the unit pixel region to isolate the two photoelectric conversion elements from each other. If light incident on the semiconductor layer is irregularly reflected by the second isolation layer, the irregularly reflected light may be reflected by the vertical reflective layer so as to be incident on the photoelectric conversion element of a desired unit pixel region. Thus, crosstalk between unit pixels may be inhibited or prevented to improve the image quality of the image sensor.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:
1. An image sensor pixel, comprising:
a substrate having a semiconductor region therein containing at least first and second photoelectric conversion elements disposed side-by-side in the semiconductor region and an electrically insulating isolation region that extends at least partially through the semiconductor region and at least partially between the first and second photoelectric conversion elements;
a micro-lens on a light receiving surface of said substrate;
a semiconductor floating diffusion region, which extends in the semiconductor region and between the first and second photoelectric conversion elements; and
an optically reflective region extending at least partially through the semiconductor region and surrounding at least a portion of at least one of the first and second photoelectric conversion elements;

wherein the micro-lens vertically overlaps with the first photoelectric conversion element, the second photoelectric conversion element, and the electrically insulating isolation region.

2. The image sensor pixel of claim 1, wherein the semiconductor floating diffusion region and the electrically insulating isolation region extend opposite each other within the semiconductor region.

3. The image sensor pixel of claim 1, wherein the semiconductor region has a trench therein that surrounds at least uppermost portions of the first and second photoelectric conversion elements on four sides thereof; wherein said optically reflective region at least partially fills the trench and surrounds the uppermost portions of the first and second photoelectric conversion elements when viewed in a direction normal to a surface of the semiconductor region.

4. The image sensor pixel of claim 1, wherein said electrically insulating isolation region comprises an optically reflective material therein.

5. The image sensor pixel of claim 1, wherein said semiconductor floating diffusion region is vertically aligned to a center of said micro-lens; and wherein both the first and second photoelectric conversion elements extend opposite the micro-lens.

6. An image sensor comprising:
a semiconductor layer having an array of micro-lenses on a light receiving surface thereof;
a first isolation layer disposed in the semiconductor layer to define a unit pixel region of the semiconductor layer;
a first photoelectric conversion element and a second photoelectric conversion element that are disposed in the semiconductor layer of the unit pixel region; and
a second isolation layer disposed in the semiconductor layer of the unit pixel region, the second isolation layer disposed between the first photoelectric conversion element and the second photoelectric conversion element and aligned vertically to a center of a corresponding micro-lens within the array of micro-lenses,
wherein the first isolation layer surrounds the first photoelectric conversion element and the second photoelectric conversion element, and
wherein the first isolation layer comprises a vertical reflective layer and an air gap within the vertical reflective layer.

7. The image sensor of claim 6, wherein the first isolation layer comprises: first patterns extending in one direction; and second patterns disposed between the first patterns so as to be connected to the first patterns, and
wherein the second isolation layer is connected to the first patterns of the first isolation layer and is spaced apart from the second patterns of the first isolation layer.

8. The image sensor of claim 7, wherein the second isolation layer comprises an additional vertical reflective layer,
wherein the additional vertical reflective layer is connected to the vertical reflective layers included in the first patterns of the first isolation layer.

9. The image sensor of claim 6, wherein the first isolation layer comprises: first patterns extending in one direction; and second patterns disposed between the first patterns so as to be connected to the first patterns, and
wherein the second isolation layer is spaced apart from the first patterns and the second patterns of the first isolation layer.

10. The image sensor of claim 6, wherein the second isolation layer comprises an additional vertical reflective layer; and an insulating layer disposed between the additional vertical reflective layer and the semiconductor layer.

11. The image sensor of claim 6, wherein the first isolation layer further comprises a vertical insulating layer covering a surface of the vertical reflective layer, and
wherein the vertical insulating layer includes the same material as the second isolation layer.

12. The image sensor of claim 6, wherein the semiconductor layer comprises: a first surface on which light is incident; and a second surface opposite to the first surface, and
wherein a distance between a bottom surface of the first isolation layer and the second surface of the semiconductor layer is smaller than a distance between a bottom surface of the second isolation layer and the second surface of the semiconductor layer.

13. The image sensor of claim 6, wherein the semiconductor layer comprises:
a first surface on which light is incident; and
a second surface opposite to the first surface,
wherein the first isolation layer penetrates the semiconductor layer, and
wherein a bottom surface of the second isolation layer is spaced apart from the second surface of the semiconductor layer.

14. The image sensor of claim 6, further comprising:
a floating diffusion region disposed in the semiconductor layer of the unit pixel region,
wherein the floating diffusion region is disposed between the first photoelectric conversion element and the second photoelectric conversion element,
wherein the floating diffusion region vertically overlaps with the second isolation layer but does not vertically overlap with the first isolation layer, and
wherein the floating diffusion region is vertically aligned to the center of the corresponding micro-lens within the array of micro-lenses.

15. The image sensor of claim 6, wherein the semiconductor layer comprises: a first surface on which light is incident; and a second surface opposite to the first surface, the image sensor further comprising:
an interconnection structure disposed on the second surface of the semiconductor layer;
a color filter disposed on the first surface of the semiconductor layer and vertically overlapping with the first and second photoelectric conversion elements; and
wherein the array of micro-lenses is on the color filter.

16. The image sensor of claim 6, wherein both the first and second photoelectric conversion elements extend opposite the corresponding micro-lens within the array of micro-lenses.

17. An image sensor comprising:
a semiconductor layer;
a first photoelectric conversion element and a second photoelectric conversion element disposed in the semiconductor layer;
a semiconductor floating diffusion region extending between the first and second photoelectric conversion elements;
a first isolation layer disposed in the semiconductor layer, the first isolation layer surrounding the first and second photoelectric conversion elements;
a second isolation layer disposed in the semiconductor layer, the second isolation layer isolating the first and second photoelectric conversion elements from each other; and a color filter vertically overlapping with both the first photoelectric conversion element and the second photoelectric conversion element when viewed from a plan view, wherein the first isolation layer comprises a vertical reflective layer; and wherein a width of the first isolation layer is greater than that of the second isolation layer;

wherein said semiconductor layer has an array of micro-lenses on a light receiving surface thereof;

wherein said semiconductor floating diffusion region is vertically aligned to a center of a corresponding micro-lens within the array of micro-lenses; and wherein both the first and second photoelectric conversion elements extend opposite the corresponding micro-lens within the array of micro-lenses.

18. The image sensor of claim 17, wherein the first isolation layer further comprises a vertical insulating layer disposed between the vertical reflective layer and the semiconductor layer, and wherein the vertical insulating layer includes the same material as the second isolation layer.

19. The image sensor of claim 17, wherein the second isolation layer comprises an additional vertical reflective layer and an insulating layer disposed between the additional vertical reflective layer and the semiconductor layer.

* * * * *